United States Patent [19]
Reich

[11] Patent Number: 6,133,949
[45] Date of Patent: Oct. 17, 2000

[54] MEASURING CIRCUIT

[75] Inventor: Joachim Reich, Ahrensburg, Germany

[73] Assignee: U.S. Philips Corporation, New York, N.Y.

[21] Appl. No.: 08/841,913

[22] Filed: Apr. 17, 1997

[30] Foreign Application Priority Data

Apr. 20, 1996 [DE] Germany ............... 196 15 745

[51] Int. Cl.[7] .................. H04N 17/00; H04N 17/02
[52] U.S. Cl. ............... 348/180; 348/181; 324/76.52; 324/76.66
[58] Field of Search .................. 348/180, 181; 377/19; 324/76.39, 76.52, 76.62, 76.64, 76.66, 76.74, 618, 621; H04N 17/00, 17/02

[56] References Cited

U.S. PATENT DOCUMENTS

| | | | |
|---|---|---|---|
| 3,614,634 | 10/1971 | Jones et al. | 327/73 |
| 3,652,872 | 3/1972 | Miller | 327/334 |
| 3,689,778 | 9/1972 | Sharp | 327/102 |
| 3,697,781 | 10/1972 | Mclean | 327/102 |
| 3,813,599 | 5/1974 | Cambell | 324/76.13 |
| 3,839,673 | 10/1974 | Acker | 324/76.66 |
| 3,859,512 | 1/1975 | Ritzinger | 702/176 |
| 4,090,133 | 5/1978 | Klyce et al. | 324/76.57 |
| 4,128,808 | 12/1978 | Westra | 455/115 |
| 4,217,524 | 8/1980 | Kinder et al. | 315/364 |
| 4,276,564 | 6/1981 | Watson et al. | 348/192 |
| 4,531,193 | 7/1985 | Yasuhara et al. | 702/183 |
| 4,720,670 | 1/1988 | Boyle | 257/48 |
| 4,786,861 | 11/1988 | Hulsing et al. | 324/46.42 |
| 5,181,191 | 1/1993 | Farwell | 368/113 |
| 5,574,499 | 11/1996 | Nasu | 348/180 |
| 5,642,487 | 6/1997 | Flynn et al. | 711/167 |

FOREIGN PATENT DOCUMENTS

| | | |
|---|---|---|
| 0274613B1 | 11/1987 | European Pat. Off. . |
| 274613A1 | 7/1988 | European Pat. Off. . |
| 596435A1 | 5/1994 | European Pat. Off. . |

OTHER PUBLICATIONS

Foreign search report from EPO for application EP 97201093, Feb. 1999.

*Primary Examiner*—John K. Peng
*Assistant Examiner*—Linus H. Lo
*Attorney, Agent, or Firm*—Edward W. Goodman

[57] ABSTRACT

For measuring the frequency bandwidth of a signal-processing circuit with minimal external influences, a measuring circuit for a signal-processing circuit (1), arranged on an integrated circuit, for processing at least a picture signal is characterized in that measuring pulses are applied to the signal-processing circuit (1), in that the measuring circuit changes the charge of a capacitance (10) arranged in the measuring circuit, dependent on the time shift experienced by the measuring pulses in the signal-processing circuit (1), in that the measuring circuit switches the measuring capacitance (10) before each measuring process to a reference potential for a short time by means of an electronic switch (8), and in that the measuring circuit is arranged on the same integrated circuit as the signal-processing circuit (1) and is activated only during a measuring process.

9 Claims, 3 Drawing Sheets

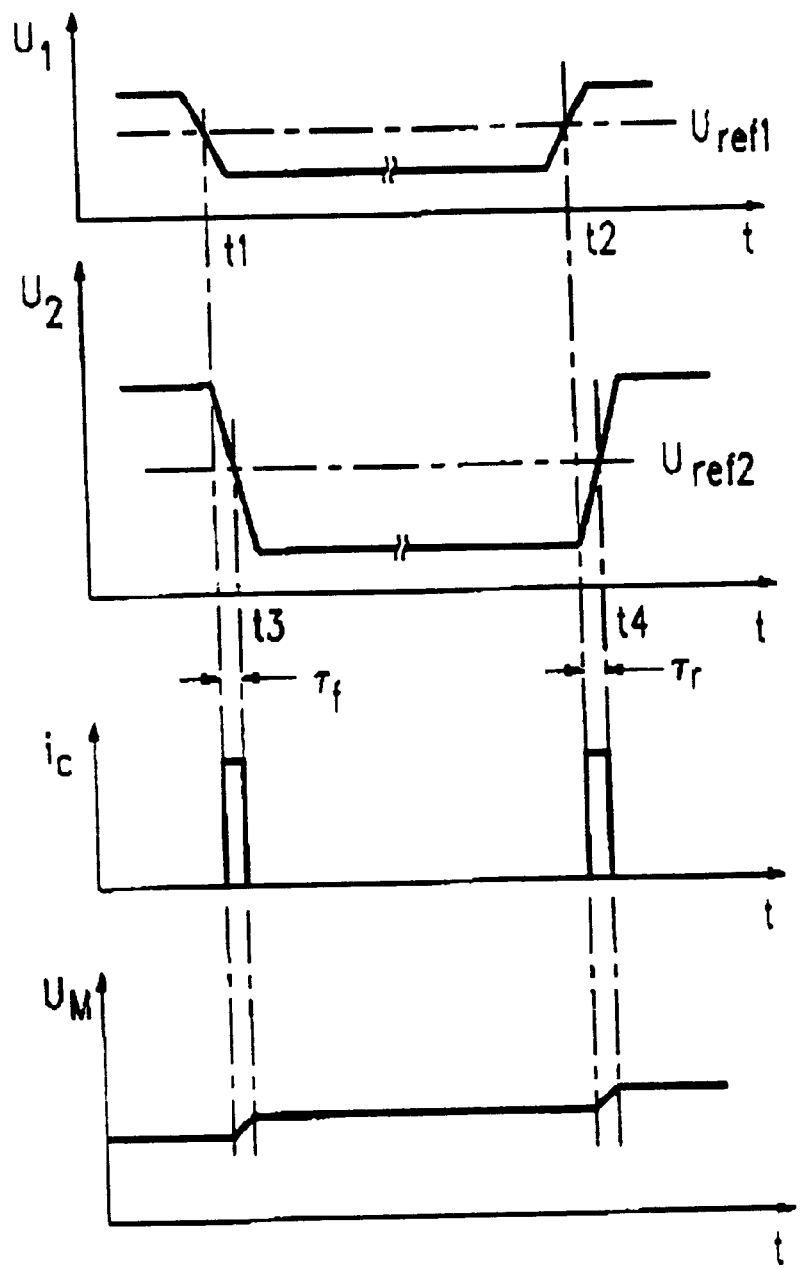

MEASURING CIRCUIT

The invention relates to a measuring circuit for a signal-processing circuit, arranged on an integrated circuit, for processing at least a picture signal.

An essential quality criterion for signal-processing circuits which process picture signals is the bandwidth of the signal-processing circuit, i.e., the frequency bandwidth at which the signal-processing circuit can process the picture signal. A too small bandwidth leads to signal distortions of the picture signal. In conventional practice, the frequency bandwidth of such signal-processing circuits is measured externally. This means that a picture signal is applied to the signal-processing circuit on the integrated circuit by means of a special measuring head, which picture signal is scanned at the output by means of the same measuring head. With reference to the signal distortions of the picture signal, the frequency bandwidth at which the signal-processing circuit processes the picture signal can be determined. A great problem in this case is that the contacts between the measuring head and the integrated circuit are insecure so that measuring errors are produced. Moreover, the connections between the measuring head and the integrated circuit, and the measuring head itself, have such a high capacitance that they already noticeably limit the bandwidth of the signal to be measured. This also leads to measuring errors.

DESCRIPTION OF THE RELATED ART

A chip-integrated circuit is known from European Patent 0 274 613, allowing a prediction of the properties of the other signal-processing circuits provided on the chip. This circuit for predicting the properties is built up separately from the other signalprocessing circuits whose properties can be estimated. The circuit for estimating the properties receives pulses which are changed in the circuit representing a first-order low-pass filter. Based on these changes, conclusions are drawn for the delay time of the signals passing through the actual, separate signal-processing circuit. However, the properties of the actual signal-processing circuit are not measured.

SUMMARY OF THE INVENTION

It is an object of the invention to provide a measuring circuit allowing determination of the frequency bandwidth of the signal-processing circuit without these errors.

According to the invention, this object is solved in that measuring pulses are applied to the signal-processing circuit, in that the measuring circuit changes the charge of a capacitance arranged in the measuring circuit, dependent on the time shift experienced by the measuring pulses in the signal-processing circuit, in that the measuring circuit switches the measuring capacitance before each measuring process to a reference potential for a short time by means of an electronic switch, and in that the measuring circuit is arranged on the same integrated circuit as the signal-processing circuit and is activated only during a measuring process.

The invention is based on the recognition that the measurement of the frequency bandwidth of the signal-processing circuit without the above-mentioned errors can most advantageously be effected on the integrated circuit itself. Therefore, the measuring circuit and the signal-processing circuit to be measured are jointly arranged on one integrated circuit.

Since it is a problem to measure the frequency bandwidth directly on the integrated circuit, the delay time of a pulse passing through the signal-processing circuit is used as a criterion. This may be realized in that, likewise as the frequency bandwidth, the signal delay time through the circuit is directly dependent on the RC product of the integrated circuit. This RC product is changed due to minor fluctuations in the manufacturing process for the integrated circuit, and particularly, by parasitic capacitances, specific capacitances of the manufacturing process and differentiating sheet resistances. By measuring the signal delay time and the RC product, which can thereby be determined, a conclusion on, for example, the frequency bandwidth of the signal-processing circuit can be drawn immediately. Moreover, conclusions about the stability of the signal-processing operation in the signal-processing circuit are possible.

Since the measuring circuit is arranged on the same integrated circuit as the signal-processing circuit to be measured, the measuring circuit is influenced by fluctuating parameters of the manufacturing process in the same way as the signal-processing circuit to be measured. The measurement of the delay time is thereby exactly possible because fluctuations of different parameters influence both circuits equally. The arrangement of the measuring circuit on the same integrated circuit as the signal-processing circuit to be measured has the particular advantage that contact resistances, contacts to be externally applied, via which the signals are supplied or removed, are dispensed with. As a result, there are no essential errors during measurement.

The signal-processing circuit is measured by the measuring circuit in such a way that the signal-processing circuit receives measuring pulses by means of the measuring circuit. The time-shift, which the measuring pulses have experienced after they have passed through the signal-processing circuit, is measured. Dependent on this measured time-shift the charge of a capacitance provided in the measuring circuit is changed. In order to draw conclusions from the charge of the capacitance for the time-shift experienced by the pulse on its passage through the signal-processing circuit, the measuring capacitance should be switched by an electronic switch to a defined reference potential for a short time before each measuring process. The measuring process does not have to comprise the measurement of the time of passage of a pulse; alternatively, a defined number of pulses may pass through the circuit in one measuring process.

In any case, the charge of the capacitance has been changed after the measuring process. This change may be rendered proportional to the number of measuring pulses used and is a measure of the RC product of the integrated circuit.

This yields a direct measurement of the RC product and, hence the bandwidth which can be easily derived therefrom without the use of external elements which may distort the measuring result.

The measuring circuit is activated only during a measuring process and does not influence the signal-processing operation of the signal-processing circuit.

In accordance with an embodiment of the invention, a predetermined number of measuring pulses is applied to the signal-processing circuit for each measuring process, while the change of the charge of the measuring capacitance generated by these pulses serves as a measuring value, and the measuring circuit supplies the voltage decreasing across the measuring capacitance as a measuring signal.

Each measuring pulse leads to a change of the charge of the measuring capacitance, namely, dependent on the delay time required by this pulse through the signal-processing circuit. For a predetermined number of measuring pulses, the charge of the measuring capacitance is thus changed to a given extent which is a measure of the RC product of the circuit. This voltage, decreasing across the measuring capacitance after the measuring process, is supplied by the measuring circuit directly as a measuring signal to the exterior. This voltage may be tapped and the desired parameters can be determined from this voltage.

Alternatively, a reverse process is possible which, in accordance with a further embodiment of the invention, is characterized in that the measuring circuit counts the number of pulses which are applied to the signal-processing circuit after the start of a measuring process until a predetermined voltage of the measuring capacitance is reached, and in that the measuring circuit supplies the counted number of pulses as a measuring value.

In this case, the change of the charge of the measuring capacitance, or a predetermined voltage which the measuring capacitance is to reach, is predetermined. Now, the number of pulses which have passed through the signal-processing circuit is counted until the predetermined voltage is reached. The dependence between the number of pulses and the change of the charge of the measuring capacitance, and, hence the voltage decreasing across this capacitance, is the same in this case, but each time the different value is considered. In this case, the measuring circuit supplies the counted number of pulses which have passed through the measuring circuit until the predetermined voltage at the measuring capacitance is reached. The measuring parameters can also be determined with reference to this value because the dependencies between the number of measuring pulses and the change of the voltage of the measuring capacitance hold true similarly as above.

For both measuring facilities, a further embodiment of the invention is characterized in that the signal-processing circuit is preceded by a blanking circuit which, dependent on the measuring pulses, applies a reference black level signal, or a reference signal having a predetermined amplitude, to the signal-processing circuit, preferably an amplitude corresponding to a white signal level of a picture signal, this blanking circuit applying the reference black level signal to the signal-processing circuit, preferably during each measuring pulse, and applying the reference signal during the other periods.

Since the signal-processing circuit is provided for the purpose of processing a picture signal, a signal which is similar to a picture signal may advantageously be utilized for the measurement. Dependent on the measuring pulses, a signal is then applied to the signal-processing circuit, which, dependent on the measuring pulses, is switched to and fro between a reference black level signal and a reference signal having a predetermined amplitude, for example, an amplitude corresponding to the white signal level of a picture signal. It is then possible to switch to the reference signal corresponding to a white value, for example, during each measuring pulse, and to the reference black level signal during the other periods in which there are no measuring pulses. These two signals are signals having clearly different levels so that the edges in the switching ranges between the two signals have high peaks and are thus readily measurable.

In accordance with a further embodiment of the invention, a clamping circuit is arranged at the output of the signal-processing circuit, this clamping circuit setting the DC level of the signal passing through the signal-processing circuit in such a way that the output signal has a predetermined nominal amplitude during the periods when the reference black level signal, possibly changed by means of the signal-processing circuit, occurs in said output signal.

An essential use of the signal-processing circuit may be, for example, an amplification of the picture signal or a change of the luminance and/or contrast values of the picture signal. The amplitude of the signal at the output of the signal-processing circuit may essentially differ. The measurement of the delay time of the measuring pulses may be influenced thereby or may be influenced in dependence upon these generated signals. It is therefore advantageous for this constellation to arrange a clamping circuit at the output of the signal-processing circuit, this clamping circuit setting the operating point of the signal-processing circuit in such a way that the output signal reaches a predetermined nominal amplitude during the periods when the reference black level signal occurs in the output signal. A defined DC level is then given for the output signal. In most cases, this clamping circuit is arranged at the output of the signal-processing circuit anyway, because it is also required for the normal fields of use of the circuit. Therefore, it should generally not be provided separately for the measuring circuit.

In accordance with a further embodiment of the invention, the measuring circuit includes a first detector which detects those instants when a first reference potential is reached during the leading edges or during the trailing edges of the input signal of the signal-processing circuit, and a second detector which detects those instants when a second reference potential is reached during the leading edges or during the trailing edges of the output signal of the signal-processing circuit.

The first detector thus compares the input signal of the signal-processing circuit with a first reference potential. During the leading edges and during the trailing edges of the pulses of the input signal, a potential which is equal to the first reference potential is reached for a short time. In a corresponding manner, a second detector compares the output signal of the signal-processing circuit with a second reference potential. In this way, instants when the respective reference potentials are reached are determined, both at the leading edges and at the trailing edges. By comparing these instants at the leading edges and/or at the trailing edges of the pulses, the time of passage of the pulses through the signal-processing circuit can be determined directly.

In accordance with another embodiment of the invention, the detectors may advantageously drive electronic switches by means of which a current source is switchable to the measuring capacitance. The electronic switches are particularly advantageous because they can switch substantially without delay. The charge of the measuring capacitance is changed in the desired manner by means of the current source.

These and other aspects of the invention are apparent from and will be elucidated with reference to the embodiments described hereinafter.

BRIEF DESCRIPTION OF THE DRAWINGS

In the drawings:

FIGS. 3A–3D show time diagrams of these signals to elucidate the mode of operation of the measuring circuit.

Figure 1:
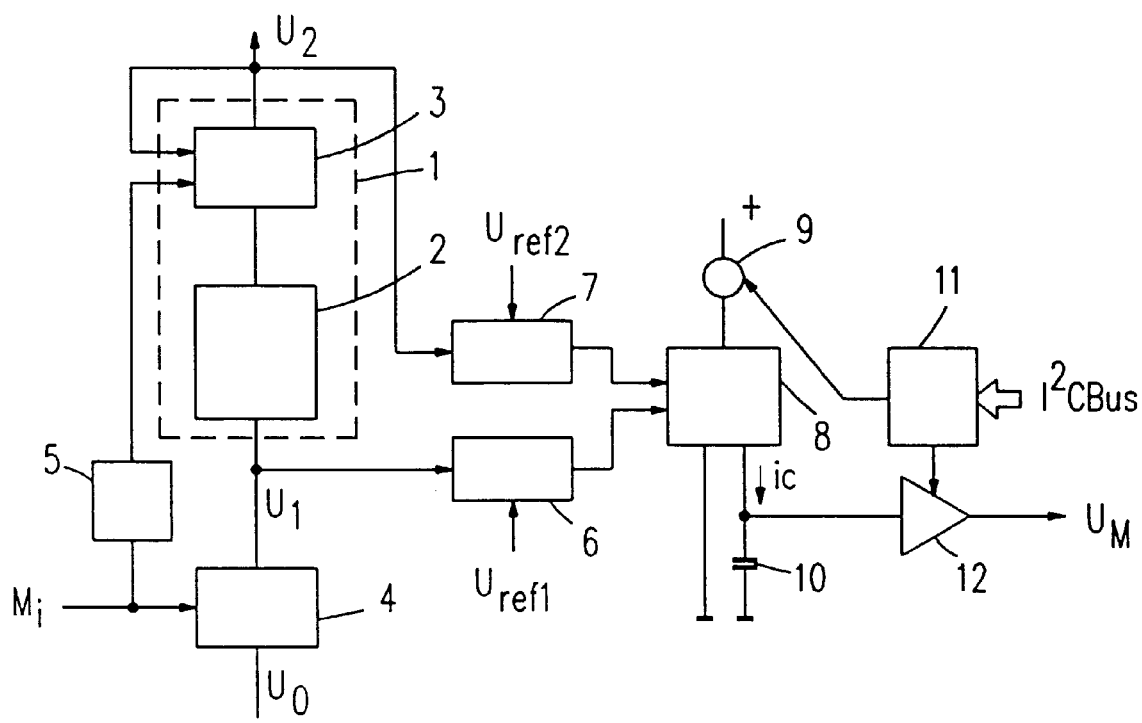
FIG. 1 is a block diagram of a measuring circuit according to the invention, together with a signal-processing circuit.

The block diagram in FIG. 1 indicates a signal-processing circuit 1. This circuit is not shown in further detail in the Figure. Only the actual circuit 2 for processing the signal and an output clamping circuit 3 are shown. The signal-processing circuit 1 may be, for example, a circuit arrangement for amplifying a picture signal, for controlling the luminance and/or contrast, or the like.

All other elements shown in FIG. 1 are part of the measuring circuit according to the invention, which is arranged on an integrated circuit, i.e., a substrate, together with the signal-processing circuit 1.

The measuring circuit receives an external signal $M_i$ comprising measuring pulses. The signal $M_i$ is applied to a blanking and clamping circuit 4 and to a circuit block 5 for controlling the clamping circuit 3 of the signal-processing circuit 1.

A signal $U_0$ to be processed by the signal-processing circuit 1 is applied as signal $U_1$ to the signal-processing circuit 1 via the blanking and clamping circuit 4. In the signal-processing circuit 1, this signal initially passes through the actual signal-processing circuit 2 and subsequently through the output clamping circuit 3. The output signal of the output clamping circuit 3, denoted by $U_2$ in the Figure, is fed back to the output clamping circuit 3.

The measuring circuit further includes two detectors 6 and 7.

The first detector 6 compares the input signal $U_1$ of the signal-processing circuit 1 with a reference potential $U_{ref1}$. In a corresponding manner, the second detector 7 compares the output signal $U_2$ of the signal-processing circuit 1 with a reference potential $U_{ref2}$.

Both detectors drive electronic switches which are arranged in a circuit block 8 and are not further shown in the Figure. Dependent on these switching periods of the electronic switches, a current supplied by a current source 9 is applied to a measuring capacitance 10. This current may be applied to ground during the other periods.

The measuring circuit further incorporates a control circuit 11 which controls the current source 9 and an impedance transformer 12 and, possibly, the generation of the measuring signal $M_i$. This control may, in turn, be performed in dependence on a control signal which may originate, for example, from an I²C bus.

During a measuring process, the charge of the measuring capacitance 10 is changed by means of the current $I_c$ coming from current source 9. The voltage decreasing across the measuring capacitance 10 is amplified by means of the impedance transformer 12 and made available as measuring signal $U_M$ at the output.

The mode of operation of this measuring circuit shown in FIG. 1 will be further explained hereinafter with reference to FIGS. 2A–2D and 3A–3D.

Figure 2A:
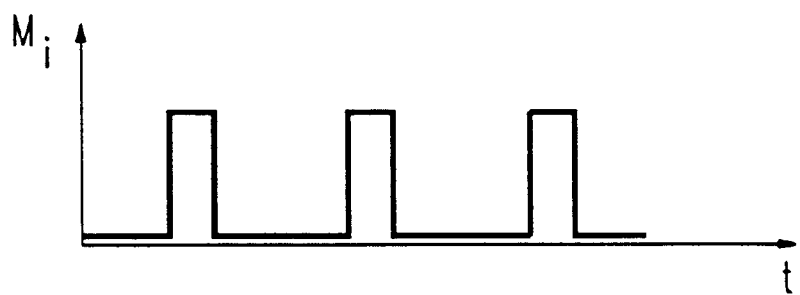
FIGS. 2A–2D show time diagrams and signals used for the measurement.

In FIG. 2A, the measuring signal $M_i$ is shown with measuring pulses as a function of time. On the one hand, it is possible to apply the measuring pulses of the measuring signal $M_i$ directly to the signal-processing circuit 1 of FIG. 1 for measuring their time delay. On the other hand, it is also advantageously possible to generate pulses in dependence on these measuring pulses.

Figure 2B:
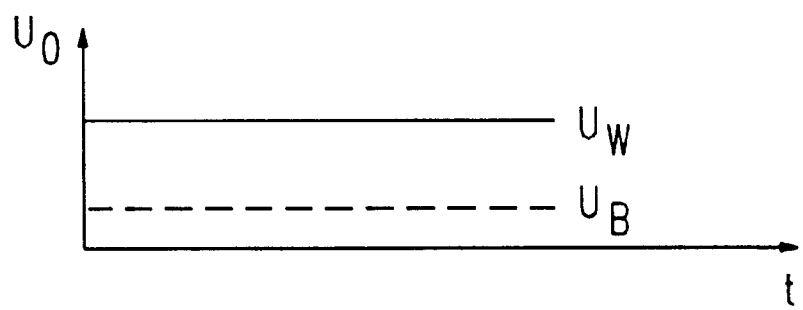

To this end, the blanking and clamping circuit 4 of the circuit arrangement shown in FIG. 1 receives two signals $U_W$ and $U_B$, which are components of the signal $U_0$. As is shown in FIG. 2B, this signal $U_B$ is a reference black level signal. This reference black level signal has an amplitude corresponding to the black porch of the conventional picture signal. The reference signal $U_W$ has an amplitude corresponding to a maximum white level of a picture signal.

Figure 2C:
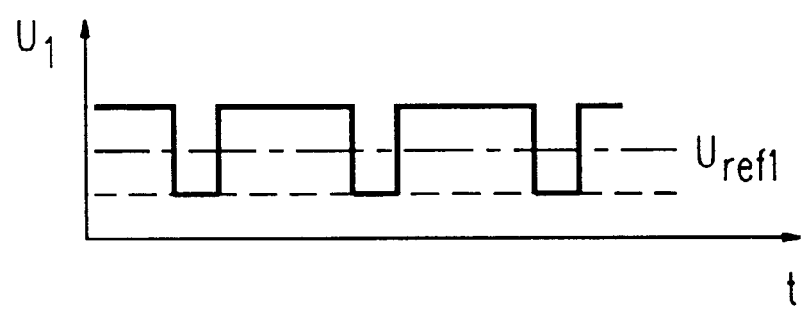

As is shown in FIG. 2C, an input signal $U_1$ is generated for the signal-processing circuit 1 by means of the blanking and clamping circuit 4 in accordance with FIG. 1, this input signal having an amplitude corresponding to the reference black level signal $U_B$ as shown in FIG. 2B during pulses occurring in the measuring signal $M_i$ as shown in FIG. 2A. During the other periods, this signal $U_1$ is switched, in accordance with FIG. 2C, to an amplitude corresponding to the reference signal $U_W$ as shown in FIG. 2B. The signal $U_1$ applied to the signal-processing circuit 1 of FIG. 1 thus comprises measuring pulses which occur simultaneously with the pulses of the measuring signal $M_i$.

Figure 2D:
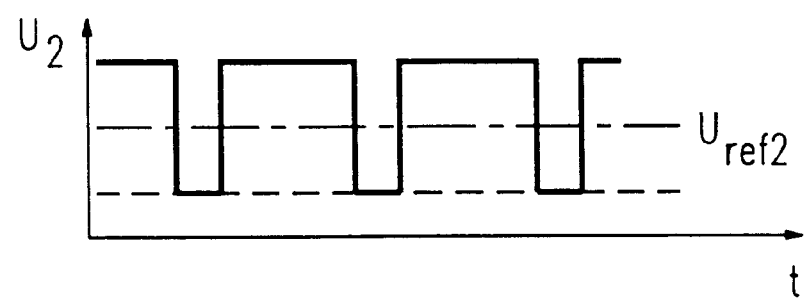

FIG. 2D shows the output signal $U_2$ of the signal-processing circuit 1 of FIG. 1. The time delay of this signal $U_2$ in accordance with FIG. 2D shows that, basically, the measuring pulses occur in the output signal again. Due to the amplification in the signal-processing, circuit, they have a different amplitude and a smaller delay as compared with the pulses in the signal $U_1$. This time delay, which the pulses have experienced due to their passage through the signal-processing circuit, is utilized for the measurement.

The signal shown in FIG. 2D is clamped in the output clamping circuit 3 of the signal-processing circuit of FIG. 1 in such a way that the signal also has an amplitude corresponding to the reference black level signal during the pulses, i.e., during the periods when it was clamped at the input at the reference black level signal. Due to the amplification of the signal in the signal-processing circuit, it has a larger white amplitude than the input signal during the other periods.

The time diagram in FIG. 3A shows, on a time axis, a pulse of the input signal $U_1$ as shown in FIG. 2C. Such a pulse is compared with the reference potential $U_{ref1}$ by means of the first detector 6 of the circuit of FIG. 1. Those instants $t_1$ and $t_2$ are determined at which the leading edge and the trailing edge of the pulse shown on the time axis in FIG. 3A exactly has the voltage value of the reference potential $U_{ref1}$.

In a corresponding manner, the signal $U_2$ leaving the signal-processing circuit of FIG. 1 is compared, as shown in FIG. 3B, with a second reference potential $U_{ref2}$ by means of the second detector 7 shown in FIG. 1. Here again, those instants are determined when the signal has exactly the voltage value corresponding to the reference potential $U_{ref2}$ during the leading and trailing edges. This is the case at the instants $t_3$ and $t_4$ in the example shown in FIG. 3B.

In the circuit shown in FIG. 1, the detectors 6 and 7 supply corresponding pulses at the instants $t_1$ to $t_4$ to the circuit block 8 with the electronic switches. Dependent on these pulses from the detectors, an electronic switch is closed during the interval $t_1$ to $t_3$, which is denoted by $\tau_f$ in FIG. 3C, so that the charge current $I_c$ coming from the current source 9 is applied to the measuring capacitance 10, as shown in FIG. 1. This is denoted by means of a pulse of the current characteristic $I_c$ as a function of time in FIG. 3C.

During the trailing edge of the pulses shown on a time axes in FIG. 3, namely between the instant $t_2$ at which the input signal $U_1$ reaches the reference potential $U_{ref1}$, and the instant $t_4$ at which the output signal reaches the reference potential $U_{ref2}$, a pulse of the signal $I_c$ is generated in a corresponding manner, in which an electronic switch is closed during the interval $t_2$ to $t_4$ and a pulse of this current is switched to the measuring capacitance. The time difference between $t_2$ and $t_4$ is denoted by $\tau_r$ in FIG. 3A–3D.

With each pulse of the signal $I_c$, the charge of the measuring capacitance 10 of the circuit shown in FIG. 1 is changed. This is shown in FIG. 3D. The output voltage $U_M$ is shown in this Figure. This measuring signal is generated by means of the impedance transformer 12 of FIG. 1, dependent on the voltage decreasing across the measuring capacitance 10. This measuring voltage $U_M$ plotted as a function of time in FIG. 3D shows that the charge of the measuring capacitance and hence the voltage value of the measuring signal $U_M$ is changed upon each pulse of the signal $I_c$ as shown in FIG. 3C. In this case, the charge of the measuring capacitance is increased at each pulse of the signal $I_c$.

Conclusions about the bandwidth of the signal-processing circuit can be drawn from this change of the charge of the measuring capacitance and hence the change of the measuring signal $U_M$, dependent on the number of pulses used. This is possible because both the bandwidth of the signal-processing circuit and the time delay of a pulse, measured in accordance with FIGS. 3A–3D through the signal-processing circuit are dependent on the physical properties of the integrated circuit, particularly the RC product generated by this circuit.

The measuring circuit shown in FIG. 1 allows measurement of the frequency bandwidth of the signal-processing circuit 1 in a relatively simple and reliable manner. Together with this circuit, the elements shown in FIG. 1 are arranged on a substrate of an integrated circuit and are therefore influenced by manufacturing tolerances of the substrate in the same way as the signal-processing circuit 1. The measuring circuit is only activated during the measuring periods. During the other periods, an input signal $U_0$, which is, for example a picture signal, is passed through the signal-processing circuit 1 in a way which is not changed by the measuring circuit.

Before and after each measuring process, or during all the periods in which no measurement takes place, the measuring capacitance 10 shown in FIG. 1 is charged to a defined reference potential. This may also be realized by means of the circuit block 8.

What is claimed is:

1. A measuring circuit for determining a frequency bandwidth of a signal-processing circuit, arranged on an integrated circuit, for processing at least a picture signal, characterized in that the measuring circuit comprises:

means for applying measuring pulses to the signal-processing circuit during a measuring process;

means for measuring a time shift of said measuring pulses through the signal-processing circuit during said measuring process;

a measuring capacitance;

means for changing a charge on said measuring capacitance dependent on said measured time shift experienced by the measuring pulses in the signal-processing circuit;

means for generating a measuring signal based on the charge on said capacitance, said measuring signal being indicative of the frequency bandwidth of the signal-processing circuit; and an electronic switch for switching the measuring capacitance before each measuring process to a reference potential for a short time, wherein the measuring circuit is also arranged on said integrated circuit along with the signal-processing circuit, and the measuring circuit is activated only during the measuring process.

2. A measuring circuit as claimed in claim 1, characterized in that said applying means applies a predetermined number of measuring pulses to the signal-processing circuit for each measuring process, in that in said changing means, the change of the charge of the measuring capacitance serves as a measuring value, and in that the generating means supplies a decreasing voltage across the measuring capacitance as the measuring signal.

3. A measuring circuit as claimed in claim 1, characterized in that the measuring circuit comprises means for counting a number of measuring pulses applied to the signal-processing circuit after the start of the measuring process until a predetermined voltage across the measuring capacitance is reached, the measuring circuit supplying the counted number of pulses as a measuring value.

4. A measuring circuit as claimed in claim 1, characterized in that the signal-processing circuit is preceded by a blanking circuit which, in dependence on the measuring pulses, alternately applies a reference black level signal and a reference signal having a predetermined amplitude to the signal-processing circuit, said predetermined amplitude corresponding to a white signal level of a picture signal, said blanking circuit applying the reference black level signal to the signal-processing circuit during each measuring pulse, and applying the reference signal during other periods.

5. A measuring circuit as claimed in claim 4, characterized in that a clamping circuit is arranged at an output of the signal-processing circuit, said clamping circuit setting a DC level of a signal passing through the signal-processing circuit in such a way that the output signal has a predetermined nominal amplitude during the periods when the reference black level signal, changed by the signal-processing circuit, occurs in said output signal.

6. A measuring circuit as claimed in claim 1, characterized in that said measuring means comprises a first detector for detecting instants when a first reference potential is reached during leading edges of the input signal of the signal-processing circuit, or during trailing edges of the input signal of the signal-processing circuit, and a second detector for detecting instants when a second reference potential is reached during leading edges of the output signal of the signal-processing circuit, or during trailing edges of the output signal of the signal-processing circuit.

7. A measuring circuit as claimed in claim 6, characterized in that the first and second detectors drive electronic switches for switchably applying a current source to the measuring capacitance.

8. A measuring circuit as claimed in claim 1, characterized in that said generating means comprises an impedance transformer having an input coupled to the measuring capacitance and an output for supplying the measuring signal.

9. A picture display device including an integrated circuit comprising a measuring circuit and a signal-processing circuit, arranged on an integrated circuit, for processing at least a picture signal, said measuring circuit determining a frequency bandwidth of said signal-processing circuit, characterized in that the measuring circuit comprises:

means for applying measuring pulses to the signal-processing circuit during a measuring process;

means for measuring a time shift of said measuring pulses through the signal-processing circuit during said measuring process;

a measuring capacitance;

means for changing a charge on said measuring capacitance dependent on said measured time shift experienced by the measuring pulses in the signal-processing circuit;

means for generating a measuring signal based on the charge on said capacitance, said measuring signal being indicative of the frequency bandwidth of the signal-processing circuit; and an electronic switch for switching the measuring capacitance before each measuring process to a reference potential for a short time, wherein the measuring circuit is also arranged on said integrated circuit along with the signal-processing circuit, and the measuring circuit is activated only during the measuring process.

* * * * *